United States Patent
Kanzawa et al.

(10) Patent No.: US 6,898,850 B2
(45) Date of Patent: May 31, 2005

(54) METHOD OF MANUFACTURING CIRCUIT BOARD AND COMMUNICATION APPLIANCE

(75) Inventors: Hideo Kanzawa, Osaka (JP); Satoru Yuuhaku, Osaka (JP); Yoshitake Hayashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/634,089

(22) Filed: Aug. 4, 2003

(65) Prior Publication Data

US 2004/0078969 A1 Apr. 29, 2004

(30) Foreign Application Priority Data

Aug. 6, 2002 (JP) ........................................ 2002-228617

(51) Int. Cl.⁷ ................................................ B23P 13/00
(52) U.S. Cl. ............................ 29/846; 29/825; 29/848; 29/849
(58) Field of Search ........................... 29/846, 825, 646, 29/848, 849; 216/18

(56) References Cited

U.S. PATENT DOCUMENTS

| | | | | |
|---|---|---|---|---|
| 4,604,160 A | * | 8/1986 | Murakami et al. | 216/18 |
| 5,197,184 A | * | 3/1993 | Crumly et al. | 29/846 |
| 5,358,604 A | * | 10/1994 | Lin et al. | 216/17 |
| 6,143,116 A | | 11/2000 | Hayashi et al. | |
| 2001/0023779 A1 | | 9/2001 | Sugaya et al. | |
| 2003/0102153 A1 | | 6/2003 | Sugaya et al. | |

FOREIGN PATENT DOCUMENTS

| | | |
|---|---|---|
| JP | 10-107445 | 4/1998 |
| JP | 2002-204049 | 7/2002 |

* cited by examiner

Primary Examiner—Carl J. Arbes
(74) Attorney, Agent, or Firm—RatnerPrestia (57) ABSTRACT

A method of manufacturing a circuit board by forming a circuit pattern in a short process and capable of performing pattern transfer with stability. The manufacturing method includes a step of superposing on a carrier a resist layer in which a circuit pattern is formed and which is formed of a conductor or an insulator, a step of filling the circuit pattern with an electroconductive material, a step of removing the resist layer from the carrier, and a step of transferring the electroconductive material filled in the circuit pattern into an electrical insulating material.

8 Claims, 9 Drawing Sheets

METHOD OF MANUFACTURING CIRCUIT BOARD AND COMMUNICATION APPLIANCE

BACKGROUND OF THE INVENTION

1. Field of the Invention

The present invention relates to a circuit board having a generally flat surface and a semiconductor device embedded therein and to a method of manufacturing the circuit board.

2. Related Art of the Invention

With the development of electronic appliances of high performance and small in size, there has been an increasing need to improve the packaging density and functions of circuit components. Also with respect to modules incorporating circuit components, there has been a demand for the capability of improving the packaging density and functions. Presently, there is a tendency to form circuit boards in a mutilayer structure in order to mount the circuit components and improve package density. In particular, a multilayer circuit board using the connection by inner vias has been put to use as a means of increasing the packaging density of a circuit. Further, there has been advanced development of a component incorporation type of circuit board capable of saving space in terms of mount area and connecting short wiring patterns between LSIs or component parts.

Figure 15:
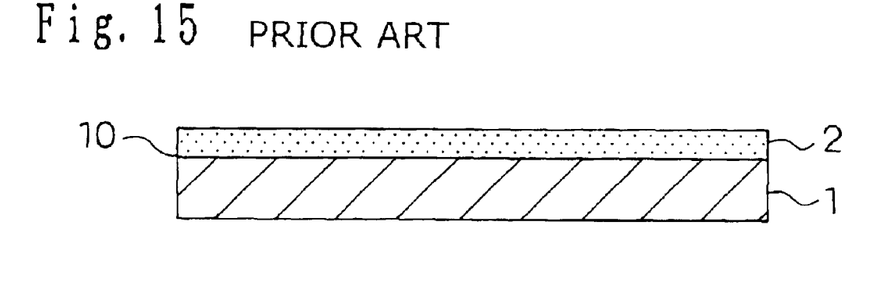
FIG. 15 is a diagram showing a step in a method of manufacturing a circuit board in a conventional art.
Figure 16:
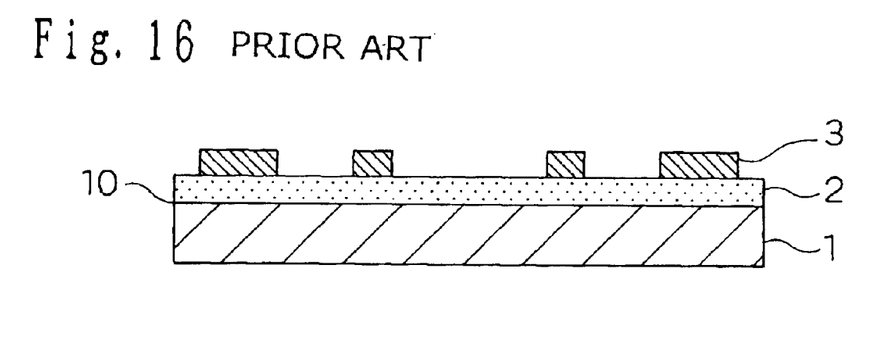
FIG. 16 is a diagram showing another step in the method of manufacturing a circuit board in the conventional art.
Figure 17:
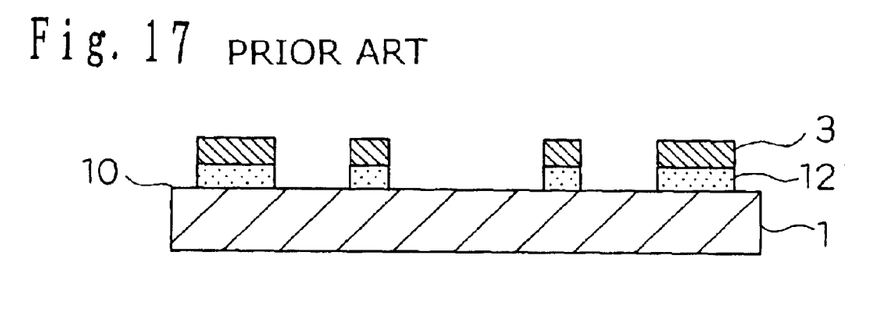
FIG. 17 is a diagram showing another step in the method of manufacturing a circuit board in the conventional art.
Figure 18:
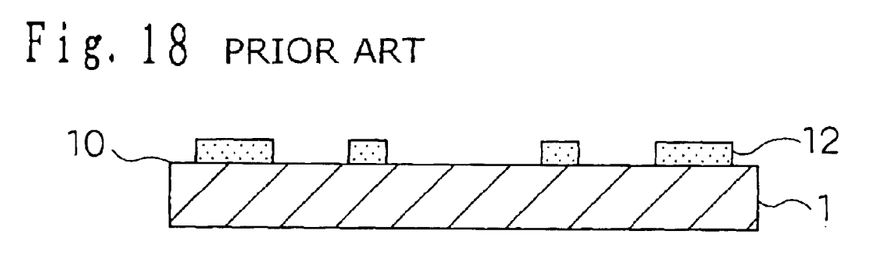
FIG. 18 is a diagram showing another step in the method of manufacturing a circuit board in the conventional art.

An example of a process for manufacturing a conventional component incorporation type of circuit board (See Japanese Patent Application Laid-Open Gazette No. 2002-204049. The disclosure of the document is incorporated herein by reference in its entirety.) will be described with reference to FIGS. 15 to 23. FIG. 15 is a cross-sectional view of a state in which a mold release layer 10 is formed on the entire area of one surface of a carrier 1 made of copper and a circuit pattern forming material 2 is formed on the mold release layer 10 by electroplating. As a material for the mold release layer 10, Cr, Ti or the like is used. As the circuit pattern forming material 2, copper, tin, zinc, nickel or gold, for example, is used. As shown in FIG. 16, a resist 3 is provided on the circuit pattern forming material 2 and formed into a desired circuit pattern by using a photolithography technique. As shown in FIG. 17, the circuit pattern forming material 2 is formed into a circuit pattern 12 by etching. Thereafter, as shown in FIG. 18, the layer of the resist 3 on the formed circuit pattern 12 is removed.

Figure 19:
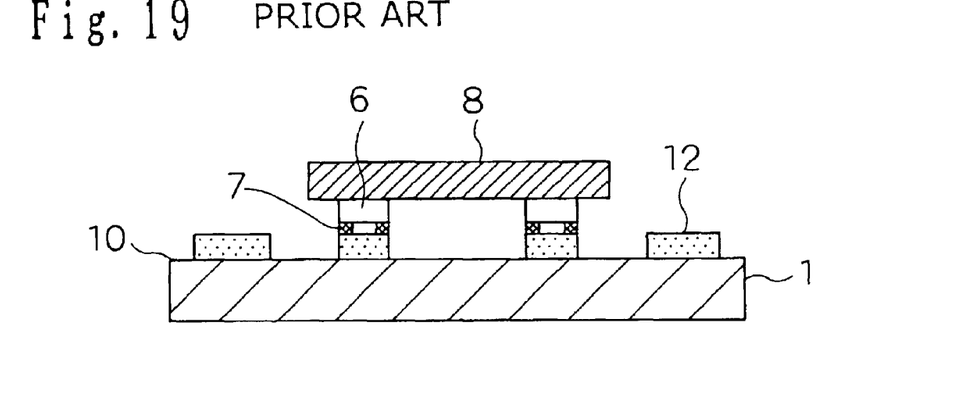
FIG. 19 is a diagram showing another step in the method of manufacturing a circuit board in the conventional art.
Figure 20:
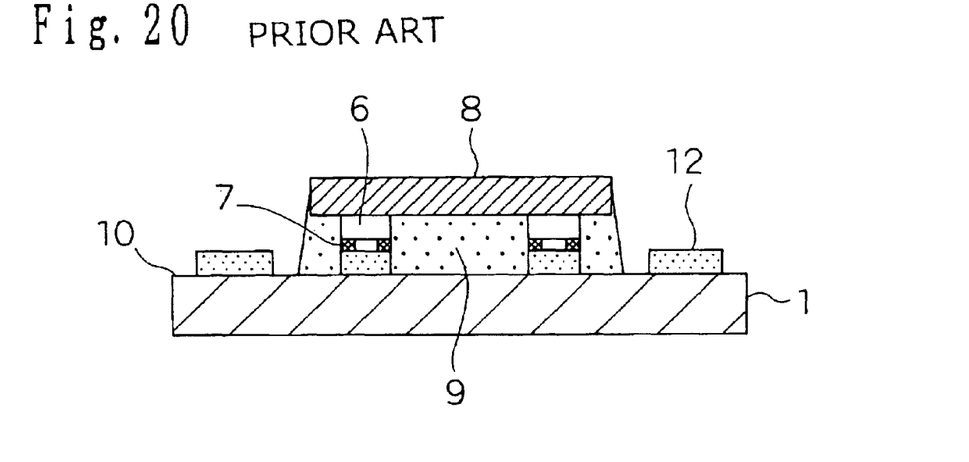
FIG. 20 is a diagram showing another step in the method of manufacturing a circuit board in the conventional art.

Then, as shown in FIG. 19, an electroconductive adhesive 7 is applied to projecting electrodes 6 made of an electroconductive material and formed on electrode pads of a bare semiconductor element 8, the bare semiconductor element 8 is thereafter mounted on the circuit pattern 12, and the electroconductive adhesive 7 is cured by heating. Thereafter, as shown in FIG. 20, an insulating resin 9 is injected into the gap between the bare semiconductor element 8 and the carrier 1 and is set to strengthen the connection between the projecting electrodes 6 and the circuit pattern 12.

Figure 21:
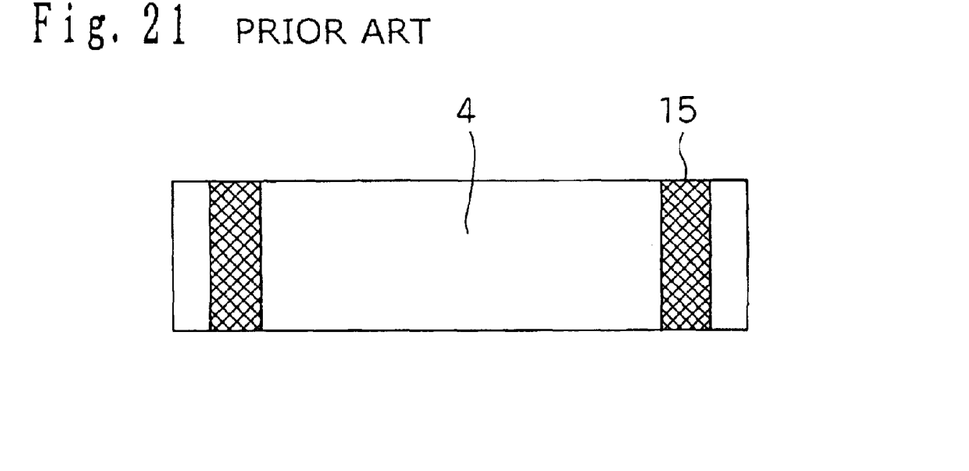
FIG. 21 is a diagram showing another step in the method of manufacturing a circuit board in the conventional art.
Figure 22:
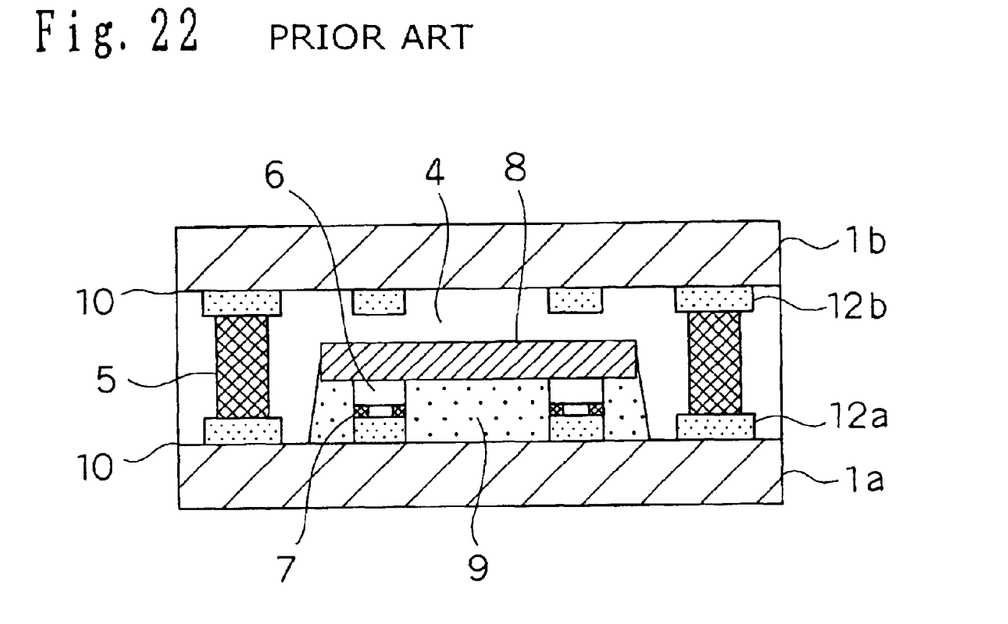
FIG. 22 is a diagram showing another step in the method of manufacturing a circuit board in the conventional art.

Then, as shown in FIG. 21, an electrical insulating layer 4 is provided and through holes 15 are formed in the electrical insulating layer 4 and are filled with a via paste to form vias 5. Thereafter, as shown in FIG. 22, the carrier 1 on which the circuit pattern 12 is formed and the electrical insulating layer 4 in which the vias 5 are formed are superposed one on another while being aligned in predetermined positions, followed by heating and pressing. The bare semiconductor element 8 and the circuit pattern 12 are thereby embedded in the electrical insulating layer 4.

Figure 23:
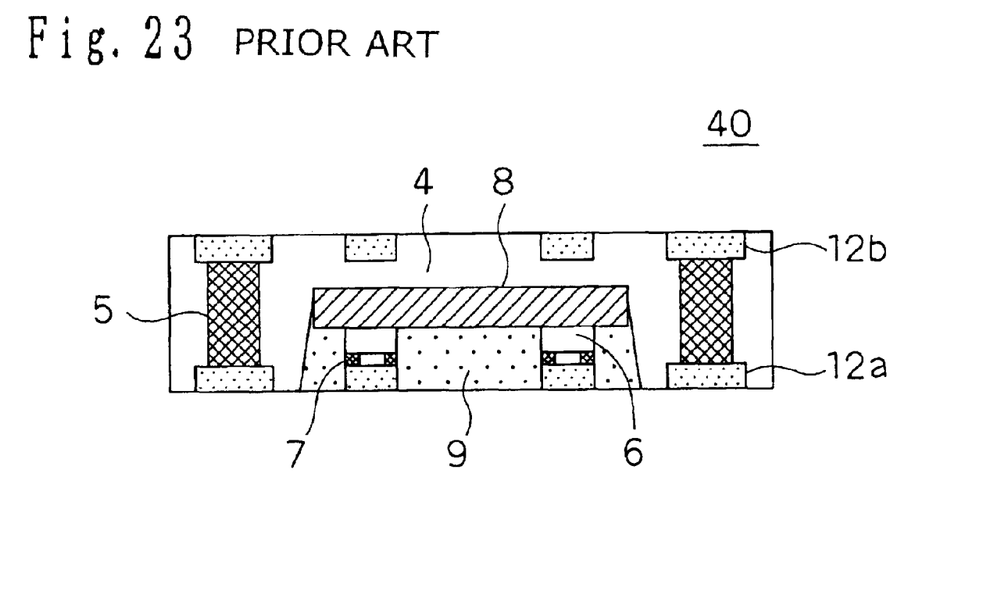
FIG. 23 is a diagram showing another step in the method of manufacturing a circuit board in the conventional art.

Finally, as shown in FIG. 23, the carrier 1 is separated after setting of the electrical insulating layer 4 to form a circuit board 40 in which the bare semiconductor element 8 and the circuit pattern 12 are embedded in the electrical insulating layer 4 and the surface of which is formed generally uniformly.

The above-described conventional method of forming the circuit pattern 12 on the carrier 1 by etching, however, necessarily includes the step of first forming the layer of circuit pattern forming material 2 on the carrier 1. The number of process steps is thereby increased, resulting in a reduction in productivity. Moreover, damage to the carrier 1 may be caused due to etching variation to considerably reduce the performance of transfer of the circuit pattern into the electrical insulating layer 4, resulting in failure to perform transfer with stability.

That is, even if the concentration of the etching solution is made uniform, there is a possibility of the etching solution unnecessarily strongly acting on the circuit pattern 12 due to the density non-uniformity of the circuit pattern 12. In such a case, there occurs not only removal of the circuit pattern forming material 2 to be etched but also erosion caused by the etching solution of the mold release layer 10 formed between the carrier 1 and the circuit pattern forming material 2. Further, even part of the carrier 1 under the mold release layer 10 may be eroded.

If part of the carrier 1 is eroded, the electrical insulating layer 4 enters the eroded region in the carrier 1 in the step shown in FIG. 22. In such a case, the electrical insulating layer 4 enters irregularities in the surface of the eroded carrier 1 to be physically combined with the carrier 1. This means that a large force is required to separate the carrier 1 from the electrical insulating layer 4 and an unnecessary force is applied to the circuit pattern 12 to separate part of the circuit pattern 12 together with the carrier 1 in the step shown in FIG. 23.

SUMMARY OF THE INVENTION

In view of the above-described problem of the conventional art, an object of the present invention is to provide a method of manufacturing a circuit board capable of realizing the formation of a circuit pattern in a short process and performing transfer with stability, or a communication appliance using a circuit board manufactured by the manufacturing method.

The $1^{st}$ aspect of the present invention is a method of manufacturing a circuit board, comprising:

a step of superposing on a supporting member a pattern layer in which circuit pattern cavities are formed in correspondence with a desired circuit pattern, and which is formed of a conductor or an insulator;

a step of filling the circuit pattern cavities with an electroconductive material;

a step of removing the pattern layer from the supporting member after filling with the electroconductive material; and a step of transferring into an insulating material the circuit pattern formed by filling the circuit pattern cavities with the electroconductive material.

The $2^{nd}$ aspect of the present invention is the method according to the $1^{st}$ aspect of the present invention, further comprising a step of forming a mold release layer on the supporting member before the pattern layer is superposed on the supporting member, wherein said step of superposing the pattern layer on the supporting member comprises a step of superposing the pattern layer on the mold release layer so that the pattern layer is not combined with the mold release layer.

The 3$^{rd}$ aspect of the present invention is the method according to the 1$^{st}$ aspect of the present invention, wherein the circuit pattern cavities are filled with an electroconductive material different from the conductor by electroplating.

The 4$^{th}$ aspect of the present invention is the method according to the 1$^{st}$ aspect of the present invention, wherein the circuit pattern cavities are filled with the electroconductive material by application or printing.

The 5$^{th}$ aspect of the present invention is the method according to the 4$^{th}$ aspect of the present invention, wherein the electroconductive material is an electroconductive paste.

The 6$^{th}$ aspect of the present invention is the method according to the 1$^{st}$ or the 3$^{rd}$ aspects of the present invention, wherein the pattern layer is formed of a photoresist.

The 7$^{th}$ aspect of the present invention is the method according to the 1$^{st}$ aspect of the present invention, further comprising a step of forming a through hole in a predetermined portion of the insulating material and filling the through holes with an electroconductive paste, wherein said step of transferring the circuit pattern comprises a step of transferring circuit patterns into two surfaces of the insulating material, and wherein the predetermined portion is a portion for connection of at least part of the circuit patterns transferred into the two surfaces of the insulating material.

The 8$^{th}$ aspect of the present invention is a communication appliance comprising:

a transmitter or a receiver having a high-frequency circuit including a circuit element mounted on a circuit board; and an antenna;

whrein said circuit board is manufactured by the method according to the 1$^{st}$ aspect of the present invention.

DESCRIPTION OF SYMBOLS 1, 101 carrier
2, 102 circuit pattern forming material and circuit pattern
3, 103 resist
4, 104 electrical insulating layer
5, 105 via
6, 106 projecting electrode
7, 107 electroconductive adhesive
8, 108 bare semiconductor element
9, 109 insulating resin
10, 110 mold release layer

PREFERRED EMBODIMENTS OF THE INVENTION

Embodiments of the present invention will be described with reference to the accompanying drawings. The present invention can be implemented without being limited to the embodiments described below.

(Embodiment 1)

FIGS. 1 to 6 are cross-sectional views of a circuit board 20 in process steps according to a circuit board manufacturing method in Embodiment 1 of the present invention. The circuit board 20 made by the process shown in FIGS. 1 to 6 has an electrical insulating layer 104 which is an insulating material according to the present invention, a circuit pattern 102 and vias 105.

Figure 1:
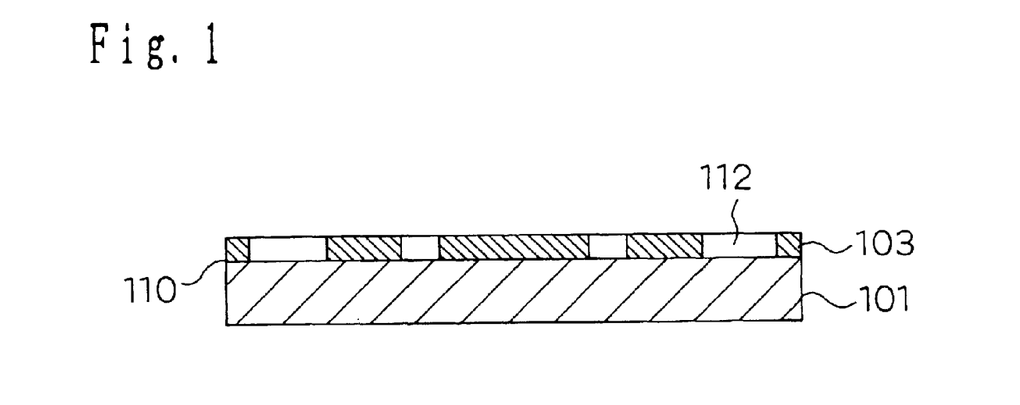
FIG. 1 is a diagram showing a step in a method of manufacturing a circuit board in Embodiment 1 of the present invention.

In Embodiment 1 shown as the method of manufacturing the circuit board 20 in accordance with the present invention, a resist 103 formed of an insulating material is first formed as shown in FIG. 1 on a carrier 101 which is an example of a supporting member in accordance with the present invention. The resist 103 has circuit pattern cavities 112 formed in correspondence with a predetermined circuit pattern by using a photolithography technique. That is, the resist 103 is formed as an example of a pattern layer in accordance with the present invention so that a circuit pattern is formed as cavities along exposed and developed portions.

Before forming the resist 103, a mold release layer 110 for enabling the circuit pattern 102 to be stably transferred into the electrical insulating layer 104 is provided between the carrier 101 and the resist 103 by electroplating or the like. As a material for the mold release layer 110, Cr, Ti or the like is used. Preferably, the resist 103 is formed on the mold release layer 110 so as not to combine with the mold release layer 110.

Figure 2:
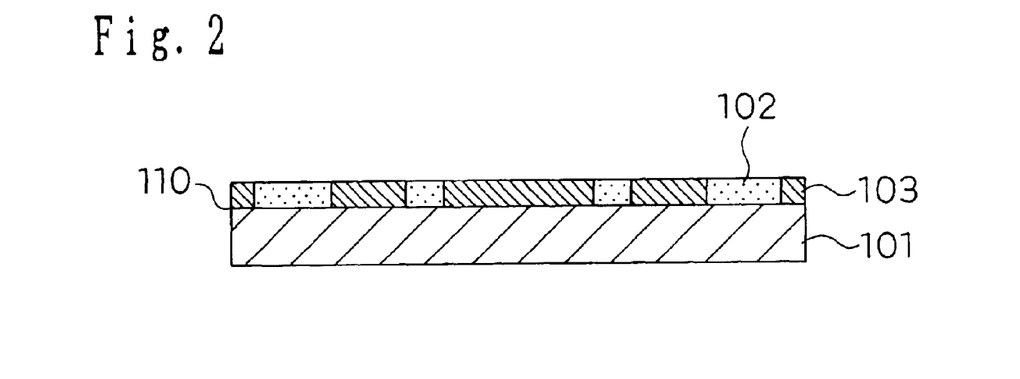
FIG. 2 is a diagram showing another step in the method of manufacturing a circuit board in Embodiment 1 of the present invention.

Then, as shown in FIG. 2, the circuit pattern cavities 112 formed in the resist 103 provided on the carrier 1 are filled with a circuit pattern forming material by electroplating to form the circuit pattern 102.

Figure 3:
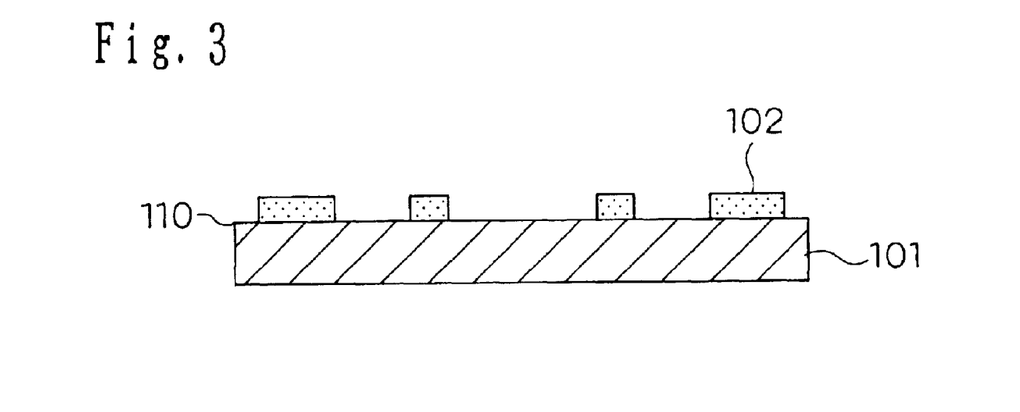
FIG. 3 is a diagram showing another step in the method of manufacturing a circuit board in Embodiment 1 of the present invention.

As the circuit pattern forming material, tin, zinc, nickel or gold, for example, can be used as well as copper. After forming the predetermined circuit pattern 102 by electroplating, the resist 103 is removed by a well-known technique, as shown in FIG. 3. By removing the resist, the desired circuit pattern 102 formed on the carrier 101 by electroplating is completed.

Figure 4:
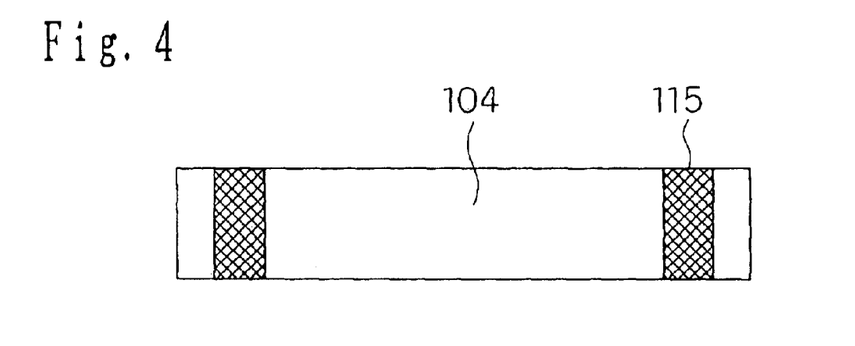
FIG. 4 is a diagram showing another step in the method of manufacturing a circuit board in Embodiment 1 of the present invention.

Then, as shown in FIG. 4, the electrical insulating layer 104 is provided and through holes 115 are formed in predetermined places in the electrical insulating layer 104. For example, as the electrical insulating layer 104, a layer of an insulating resin, a mixture of a filler and an insulating resin, or the like can be used. As the insulating resin, a thermosetting resin, a thermoplastic resin or a photocuring resin can be used. An epoxy resin, a phenolic resin or a cyanate resin having high heat resistance may be used to improve the heat resistance of the electrical insulating layer 104.

Also, a resin comprising a fluoric resin, a polytetrafluoroethylene (PTFE) resin, a polyphenylene oxide (PPO) resin, a polyphenylene ether (PPE) resin, a liquid crystal polymer having a low dielectric loss tangent $\delta$, or a resin obtained by modification some of such resins can be the electrical insulating layer 104 to improve high-frequency characteristics of the electrical insulating layer 104.

In the case where a mixture of a filler and an insulating resin is used as the electrical insulating layer 104, it is possible to easily control the linear expansion coefficient, the thermal conductivity and the dielectric constant of the electrical insulating layer 104 by properly selecting the filler and the insulating resin.

For example, alumina, boron nitride or aluminum nitride may be used as the filler to improve the thermal conductivity of the electrical insulating layer 104, thereby enabling manufacturing of a circuit board having thermal conductivity higher than that of the conventional glass-epoxy circuit board. Also, in such a case, heat generated in an electronic component or a bare semiconductor element 108 (described in the description of Embodiment 2) incorporated in the electrical insulating layer 104 can be effectively dissipated.

After forming the through holes 115 as described above, the through holes 115 are filled with a via paste to form vias 105. As a method of forming the through holes 115, laser machining, drilling, punching, for example, can be used. Laser machining is particularly preferred because the through holes 115 can be formed with a fine pitch by laser machining without producing shavings.

As via paste material, a mixture of an electroconductive powder and a resin, e.g., a mixture of a powder of a metal such as gold, silver, copper, nickel or a carbon powder and a thermosetting resin or a photocuring resin is used. The through holes 115 are filled with such a via paste material to form the vias 105.

Figure 5:
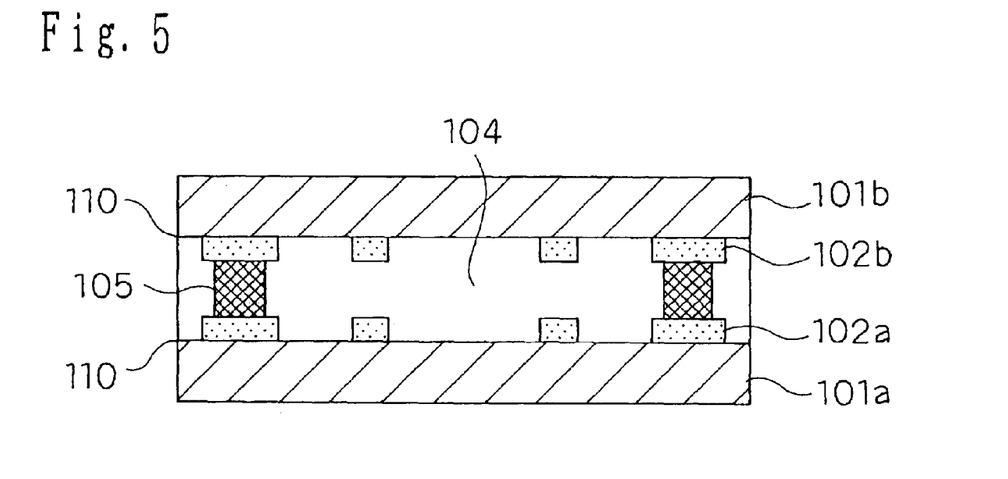
FIG. 5 is a diagram showing another step in the method of manufacturing a circuit board in Embodiment 1 of the present invention.

Then, as shown in FIG. 5, the electrical insulating layer 104 in which the vias 105 are formed and the carrier 101 on which the desired circuit pattern 102 is formed are superposed one on another in predetermined positions, followed by heating and pressing. The circuit pattern 102 is thereby embedded in the electrical insulating layer 104. At this time, the electrical insulating layer 104 may be maintained in a half-cured state to facilitate embedding.

FIG. 5 shows a state in which a lower carrier 101a on which a circuit pattern 102a is formed and an upper carrier 101b on which a circuit pattern 102b is formed, which carriers are made by repeating the steps shown in FIGS. 1 through 3, are superposed on each other, the carrier 101a and the carrier 101b being respectively placed above and below the electrical insulating layer 104. The predetermined circuit patterns 102a and 102b are connected by vias 105.

Figure 6:
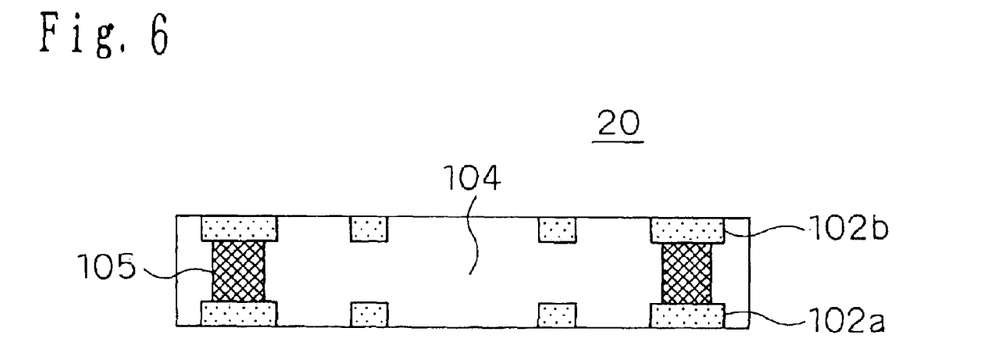
FIG. 6 is a diagram showing another step in the method of manufacturing a circuit board in Embodiment 1 of the present invention.

Finally, as shown in FIG. 6, the carriers 101a and 101b are separated after setting of the electrical insulating layer 104. Thus, the circuit pattern forming material filled in the circuit pattern cavities 112 (i.e., circuit patterns 102a and 102b) can be transferred into the electrical insulating layer 104, and the circuit board 20 can be made in which the circuit patterns 102a and 102b are embedded and the surface of which is formed generally uniformly.

(Embodiment 2)

An example of a method of manufacturing a circuit board 30 incorporating an electronic component or a bare semiconductor element 108 will be described as Embodiment 2 of the present invention with reference to FIGS. 7 to 14. FIGS. 7 to 14 are cross-sectional views of a circuit board 30 in process steps according to the method of manufacturing the circuit board 30 incorporating the bare semiconductor element 108 according to the present embodiment. The materials used in Embodiment 2 are the same as those in Embodiment 1 unless otherwise specified. The same components as those of Embodiment 1 are indicated by the same reference numerals and description of them will not be repeated.

Figure 7:
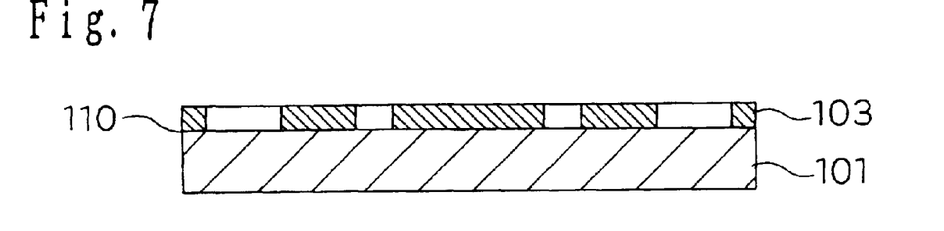
FIG. 7 is a diagram showing a step in a method of manufacturing a circuit board in Embodiment 2 of the present invention.
Figure 8:
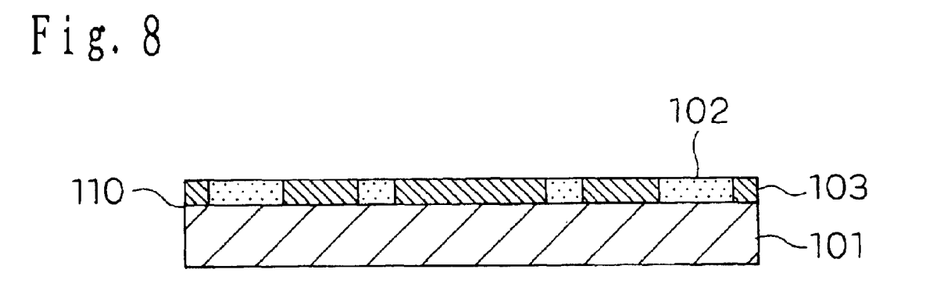
FIG. 8 is a diagram showing another step in the method of manufacturing a circuit board in Embodiment 2 of the present invention.
Figure 9:
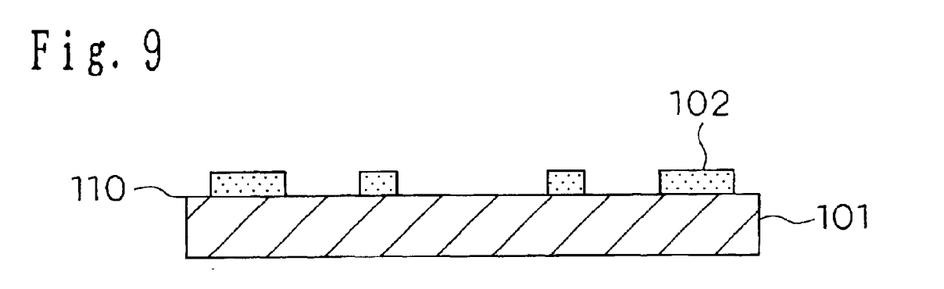
FIG. 9 is a diagram showing another step in the method of manufacturing a circuit board in Embodiment 2 of the present invention.
Figure 10:
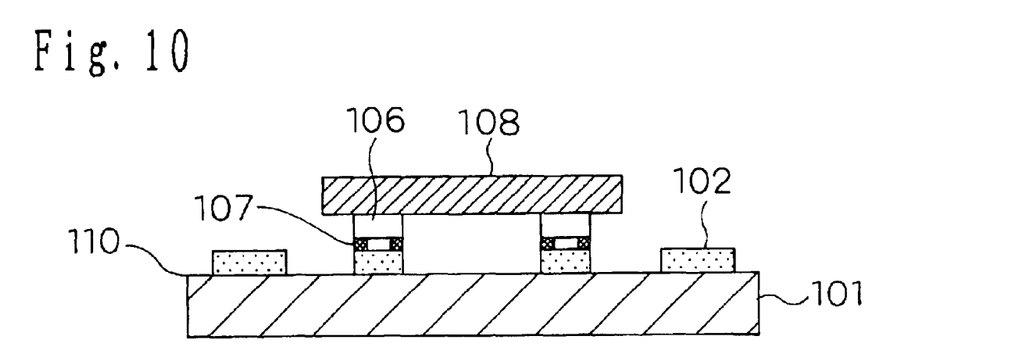
FIG. 10 is a diagram showing another step in the method of manufacturing a circuit board in Embodiment 2 of the present invention.

Manufacturing steps shown in FIGS. 7, 8, and 9 as steps according to the circuit board manufacturing method in Embodiment 2 of the present invention are the same as those in Embodiment 1, and description of them will not be repeated. After the manufacturing step shown in FIG. 9, as shown in FIG. 10 an electroconductive adhesive 107 is applied to projecting electrodes 106 made of an electroconductive material and formed on electrode pads of the bare semiconductor element 108, and the bare semiconductor element 108 is thereafter placed in a predetermined position on the circuit pattern 102. In this state, the electroconductive adhesive 107 is cured by heating.

Figure 11:
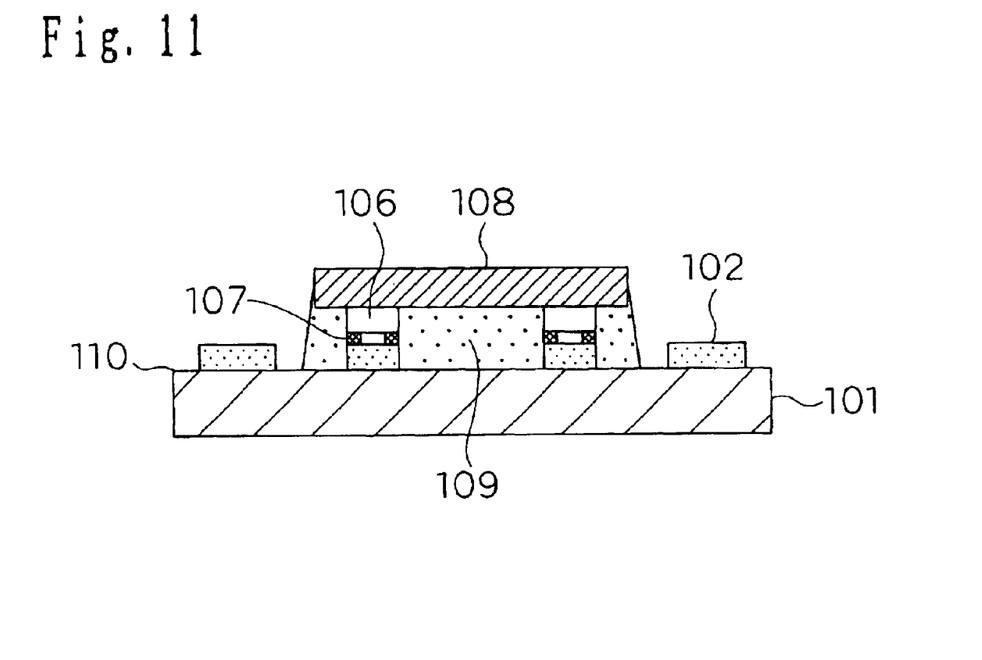
FIG. 11 is a diagram showing another step in the method of manufacturing a circuit board in Embodiment 2 of the present invention.

Thereafter, as shown in FIG. 11, an insulating resin 109 is injected into the gap between the bare semiconductor element 108 and the carrier 101 and is set to strengthen the connection between the projecting electrodes 106 and the circuit pattern 102. As the insulating resin 109, a thermosetting resin, a photocuring resin or the like can be used.

Figure 12:
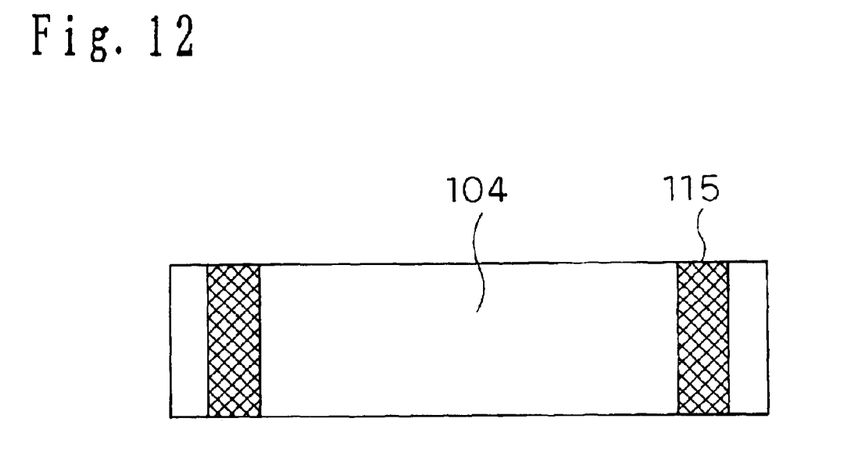
FIG. 12 is a diagram showing another step in the method of manufacturing a circuit board in Embodiment 2 of the present invention.
Figure 13:
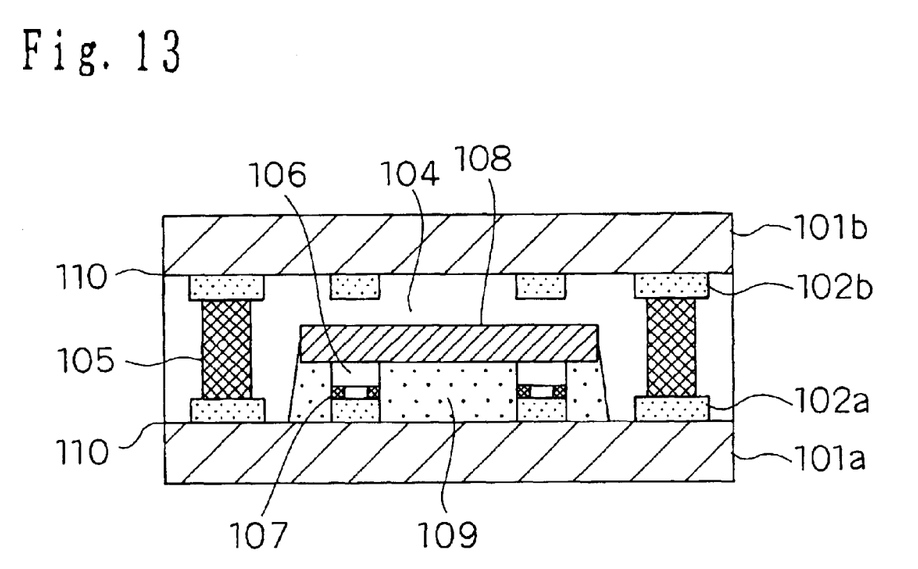
FIG. 13 is a diagram showing another step in the method of manufacturing a circuit board in Embodiment 2 of the present invention.

Then, in the step shown in FIG. 12, i.e., the same step as that shown in FIG. 4, an electrical insulating layer 104 in which through holes 115 are formed is formed. Then, as shown in FIG. 13, the carrier 101a on which the circuit pattern 102a is formed, the carrier 101b on which the circuit pattern 102b is formed, and the electrical insulating layer 104 are superposed one on another in predetermined positions, followed by heating and pressing. The bare semiconductor element 108 and the circuit patterns 102 are thereby embedded in the electrical insulating layer 104. At this time, the electrical insulating layer 104 may be maintained in a half-cured state to facilitate embedding. FIG. 13 shows a state in which the circuit pattern 102a is formed on the lower carrier 101a, the circuit pattern 102b is formed on the upper carrier 101b, and the circuit pattern 102a and the circuit pattern 102b are connected to each other by the vias 105.

Figure 14:
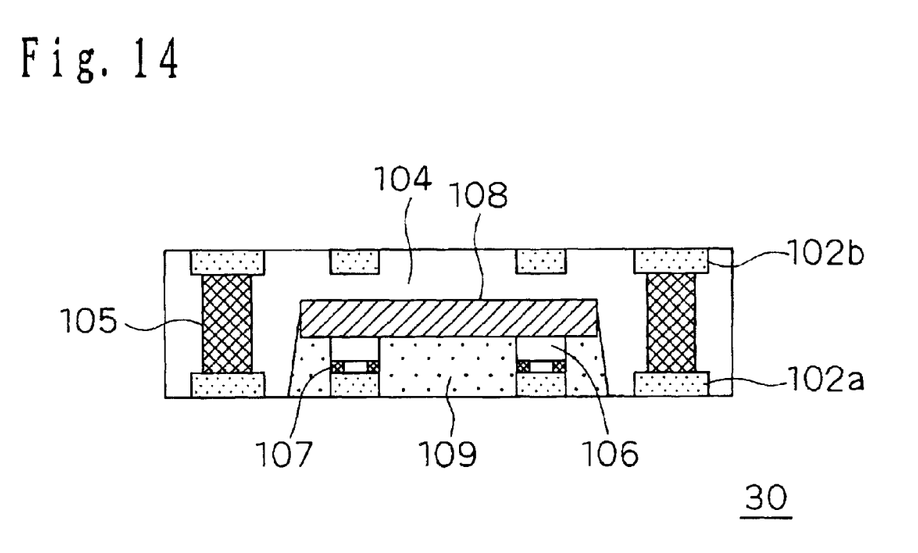
FIG. 14 is a diagram showing another step in the method of manufacturing a circuit board in Embodiment 2 of the present invention.

Finally, as shown in FIG. 14, the carriers 101a and 101b are separated after setting of the electrical insulating layer 104. Thus, the circuit board 30 can be made in which the bare semiconductor element 108 and the circuit patterns 102a and 102b are embedded in the electrical insulating layer 104 and the surface of which is formed generally uniformly. Since the bare semiconductor element 108 is embedded in the electrical insulating layer 104, the entire size of the circuit board 30 can be reduced. That is, the circuit board 30 made by the manufacturing method of this embodiment is smaller in overall size than the combination of the circuit board 20 made by the manufacturing method of Embodiment 1 and the corresponding semiconductor element formed on the circuit board 20.

According to the above description of Embodiment 2, the bare semiconductor element 108 is set on the circuit pattern 102 by using electroconductive adhesive 107. Alternatively, a heating and pressing method using an anisotropic conductive film (ACF) or a non-conductive film (NCF) may be used. For mounting of the bare semiconductor element 108 on the circuit pattern 102, a face-up wire bonding method or the like may be used.

According to Embodiment 2 described above a package type semiconductor device may be used instead of the bare semiconductor element 108. In such a case the entire size of the circuit board 20 comparatively increases, but otherwise the same effects as those described above can be achieved.

According to the above description of Embodiment 2, the semiconductor element is mounted on the circuit pattern 102 in the circuit board 30. However, an element for a high-frequency circuit, e.g., a resistor, a capacitor or a quartscrystal oscillator may be mounted instead of the semiconductor element.

According to the above description, the circuit pattern 102 is formed by filling the circuit pattern cavities 112 formed in the resist 103 with a circuit pattern forming material by electroplating. Alternatively, the circuit pattern 102 may be formed by filling the circuit pattern cavities 112 with an electroconductive paste. Also, the circuit pattern 102 may be formed by screen printing.

According to the above description, the resist 103, which is an example of the formation of the pattern layer in accordance with the present invention, is formed on the carrier 101. However, the pattern layer of the present invention may be formed of an insulating material other than the resist 103. In such a case, circuit pattern cavities 112 are formed by a method other than the method using a photoresist and are filled with the circuit pattern forming material by the above-described method. After filling the cavities with the circuit pattern forming material, the insulating layer may be removed from the carrier 101 by a suitable method to form the circuit pattern 102. Also in such a case, the same effects as those described above can be achieved.

While use of an insulating material in place of the resist 103 as the pattern layer of the present invention has been described, an electroconductive material such as a metal mask may be formed in place of the resist 103 by printing or the like. In such a case, circuit pattern cavities 112 are formed in the metal mask or the like in correspondence with a circuit pattern as described above and are filled or applied with an electroconductive material such as an electroconductive paste or with a circuit pattern forming material by screen printing or the like. Preferably, the filled electroconductive material is different from the electroconductive material of the metal mask or the like. After filling of the circuit pattern forming material, the metal mask or the like is removed by a suitable method to form the circuit pattern 102. The metal mask may be only placed on the carrier 101 instead of being printed on the carrier 101. In such a case, the manufacturing process includes a method of manually separating the mask as a method of removing the metal mask. Also in such a case, the same effects as those described above can be achieved.

While the method of manufacturing a circuit board in which circuit patterns are formed on the opposite sides of the electrical insulating layer 104 has been described, the circuit board manufacturing method of the present invention may be a method of forming a circuit board in which a circuit pattern is formed on only one side of the electrical insulating layer 104. In such a case, the same manufacturing process that described above may be performed by using one of the carriers 101a and 101b on which no circuit pattern 102 is formed.

While the supporting member of the present invention has been described as a copper carrier, it may be made of any material such as a metal other than copper or a material other than metals if it is capable of supporting the circuit pattern 102 and can be transferred to the electrical insulating layer 104.

According to the above description, the mold release layer 110 is formed between the carrier 101 and the resist 103 or the like. However, the mold release layer 110 is not necessary if, for example, in the step shown in FIG. 6, the circuit patterns 102a and 102b can be stably transferred into the electrical insulating layer 104, and if the carriers 101a and 101b can be stably separated from the electrical insulating layer 104. Also in such a case, the same effects as those described above can be achieved.

Figure 24:
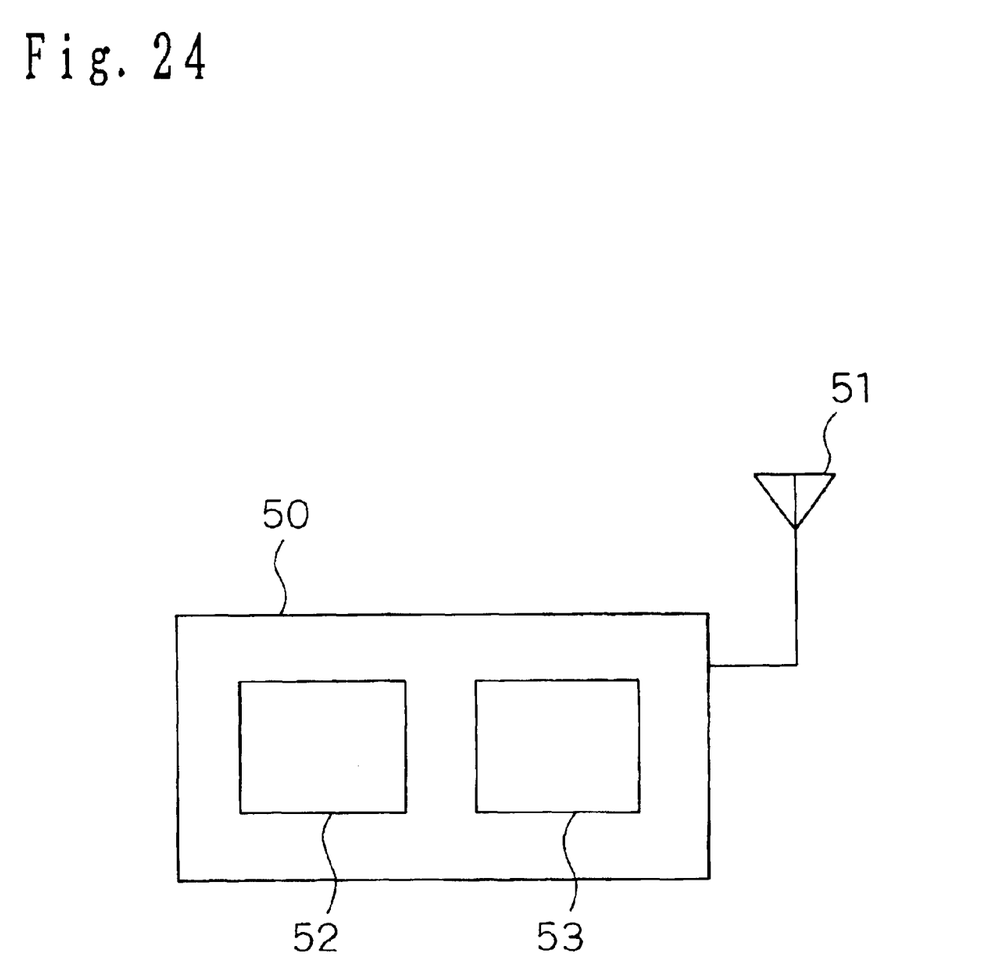
FIG. 24 is a diagram showing a communication appliance having a circuit board manufactured by the circuit board manufacturing method of the present invention.

The present invention also includes in its scope a communication appliance 50 provided with a transmitter 52 or a receiver 53 having a high-frequency circuit using circuit elements mounted on a circuit board made in the above-described manner, and an antenna 51. FIG. 24 shows an example of the configuration of such a communication appliance.

According to the present invention, a method of manufacturing a circuit board capable of realizing the formation of a circuit pattern in a short process and performing pattern transfer with stability, or a communication appliance using a circuit board manufactured by the manufacturing method can be provided.

What is claimed is:

1. A method of manufacturing a circuit board, comprising:
   a step of superposing on a supporting member a pattern layer in which circuit pattern cavities are formed which correspondence with a desired electrocondutive circuit pattern;
   a step of filling the circuit pattern cavities with an electroconductive material;
   a step of removing the pattern layer from the supporting member after filling with the electroconductive material and thereby providing the electroconductive circuit pattern on the supporting member; and a step of transferring into an insulating material the electroconductive circuit pattern formed by filling the circuit pattern cavities with the electroconductive material.

2. The method according to claim 1, further comprising a step of forming a mold release layer on the supporting member before the pattern layer is superposed on the supporting member, wherein said step of superposing the pattern layer on the supporting member comprises a step of superposing the pattern layer on the mold release layer so that the pattern layer is not combined with the mold release layer.

3. The method according to claim 1, wherein the circuit pattern cavities are filled with an electroconductive material different from the conductor by electroplating.

4. The method according to claim 1, wherein the circuit pattern cavities are filled with the electroconductive material by application or printing.

5. The method according to claim 4, wherein the electroconductive material is an electroconductive paste.

6. The method according to claim 1, wherein the pattern layer is formed of a photoresist.

7. The method according to claim 1, further comprising a step of forming a through hole in a predetermined portion of the insulating material and filling the through holes with an electroconductive paste, wherein said step of transferring the circuit pattern comprises a step of transferring circuit patterns into two surfaces of the insulating material, and wherein the predetermined portion is a portion for connection of at least part of the circuit patterns transferred into the two surfaces of the insulating material.

8. The method according to claim 3, wherein the pattern layer is formed of a photoresist.

* * * * *